(12) United States Patent
Atkinson et al.

(10) Patent No.: US 7,374,866 B2
(45) Date of Patent: May 20, 2008

(54) SYSTEM AND METHOD FOR EXPOSURE OF PARTIAL EDGE DIE

(75) Inventors: Chris D. Atkinson, Lewisville, TX (US); Richard L. Guldi, Dallas, TX (US); Shangting Detweiler, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 497 days.

(21) Appl. No.: 10/961,939

(22) Filed: Oct. 8, 2004

(65) Prior Publication Data

US 2006/0078828 A1    Apr. 13, 2006

(51) Int. Cl.
*G03F 7/00* (2006.01)
(52) U.S. Cl. ............................ 430/313; 430/396
(58) Field of Classification Search ........... 430/311, 430/313, 396
See application file for complete search history.

(56) References Cited

U.S. PATENT DOCUMENTS

| | | | | |
|---|---|---|---|---|
| 4,579,760 A | * | 4/1986 | Hause et al. | 428/66.7 |
| 5,960,305 A | * | 9/1999 | Kumar | 438/598 |
| 5,972,569 A | * | 10/1999 | Jeng et al. | 430/312 |
| 6,331,489 B2 | * | 12/2001 | Sasaki | 438/745 |
| 2001/0041435 A1 | * | 11/2001 | Li | 438/592 |

OTHER PUBLICATIONS

Stanley Wolf et al., "Silicon Processing for The VLSI ERA," title page plus pp. 418-420, 437-438, and 444, Sep. 1, 1986.

* cited by examiner

*Primary Examiner*—Mark F. Huff
*Assistant Examiner*—Caleen O Sullivan
(74) *Attorney, Agent, or Firm*—Wade J. Brady, III; Frederick J. Telecky, Jr.

(57) ABSTRACT

According to one embodiment of the present invention, a method of forming a semiconductor device includes forming a photoresist layer on a surface of a wafer. The wafer includes an array of die that includes a plurality of complete die and at least one partial edge die. The wafer has an edge that has a substantially rounded profile causing undersized patterns in semiconductor devices formed on partial edge die. A first exposure intensity is assigned to a first group of die on the surface of the wafer. The first group of die includes a group of complete die, and the first exposure intensity is assigned based at least in part on the location of the first group of die on the surface of the wafer. A second exposure intensity is assigned to a second group of die on the surface of the wafer. The second group of die includes at least one partial edge die. The second exposure intensity less than the first exposure intensity to compensate for reduced line width due to the wafer edge topography. Energy is directed at the second group of die at the second exposure intensity to avoid over-exposure of the second group of die.

12 Claims, 3 Drawing Sheets

SYSTEM AND METHOD FOR EXPOSURE OF PARTIAL EDGE DIE

TECHNICAL FIELD OF THE INVENTION

This invention relates generally to the field of semiconductor devices and, more particularly, to a system and method for the exposure of partial edge die.

BACKGROUND OF THE INVENTION

A scanner or other light source may be used during conventional fabrication processes to form devices or features on the surface of a wafer. Specifically, a light source may be operated to generate a beam of energy which is directed at a portion of the wafer. The energy transmitted from the light source through a mask is typically directed onto the wafer surface to cover a spatial area called the "shot" area. The shot area generally covers a group of die on the wafer or a single die depending on the size of the die and the configuration of the mask. Although a wafer has a generally horizontal surface on which the features are formed, the edge of the wafer is typically rounded such that the wafer has a substantially rounded profile. Typically, the light source is operated at a standard exposure intensity for all devices and features formed on the surface of the wafer regardless of the location of the particular devices and features on the surface of the wafer. For example, the exposure intensity of the shot of energy used in the formation of devices and features near the edge of the wafer is the same as the exposure intensity of the shot of energy used in the formation of devices and features near the center of the wafer. This standard exposure intensity, however, may result in deformities in the features formed near the rounded edge of the wafer, especially on partial edge shot. Because the features may have reduced baseline dimensions, the adherence of the features to the wafer surface may be weakened. Where such features become detached during subsequent semiconductor fabrication processes, the detached features may provide a source of particle contamination.

SUMMARY OF EXAMPLE EMBODIMENTS

From the foregoing it may be appreciated by those skilled in the art that a need has arisen for a system and method for exposure of partial edge shot on a wafer. In accordance with the present invention, a system and method for forming semiconductor devices on the surface of the wafer is provided that substantially eliminates or greatly reduces disadvantages and problems associated with conventional semiconductor fabrication equipment.

According to one embodiment of the present invention, a method of forming a semiconductor device includes forming a photoresist layer on the surface of a wafer. The wafer includes an array of die that includes a plurality of complete die and at least one partial edge die. The wafer has an edge that has a substantially rounded profile causing undersized patterns in semiconductor devices formed on partial edge die. A first exposure intensity is assigned to a first group of die on the surface of the wafer. The first group of die includes a group of complete die, and the first exposure intensity is assigned based at least in part on the location of the first group of die on the surface of the wafer. A second exposure intensity is assigned to a second group of die on the surface of the wafer. The second die includes at least one partial edge die. The second exposure intensity less than the first exposure intensity to compensate for reduced line width due to the wafer edge topography. Energy is directed at the second group of die at the second exposure intensity to avoid over-exposure of the second group of die.

Certain examples of the invention may provide one or more technical advantages. A technical advantage of one exemplary embodiment of the present invention is that exposure intensities may be assigned to each shot area on a wafer based at least in part on the location of the shot area on the wafer. As a result, the energy used to expose portions of photoresist material on the wafer may be varied as is appropriate for the reduction of pattern deformities. For example, a lower intensity of energy may be used in the formation of features near the edge of a wafer than that that is used in the formation of feature near the center of the wafer. A further technical advantage may be that the linewidth of features formed on partial edge die may be increased relative to its value with the exposure intensity used at the wafer center to compensate for line width reduction occurring at the wafer edge. Consequently, adherence of the features to the wafer may also be improved. A further technical advantage may be that fewer features may become detached from partial edge die during subsequent fabrication processes, and the occurrence of gross particles in wet clean baths may be reduced. Accordingly, the contamination of wafers during semiconductor fabrication processes may be substantially prevented.

Other technical advantages may be readily apparent to one skilled in the art from the figures, descriptions and claims included herein. None, some, or all of the examples may provide technical advantages.

BRIEF DESCRIPTION OF THE DRAWINGS

For a more complete understanding of the present invention and its features and advantages, reference is now made to the following description, taken in conjunction with the accompanying drawings, in which.

DETAILED DESCRIPTION OF EXAMPLE EMBODIMENTS

Semiconductor devices and features may be formed on the surface of a wafer. In various embodiments, the wafer may include a thin polished slice of crystal material cut from a crystal cylinder grown for the purpose of semiconductor fabrication. The starting material of a wafer may comprise silicon, gallium arsenide, or other suitable substrate material. According to one typical fabrication technology, a wafer may be eight inches in diameter and have a thickness on the order of 0.5 to 2.0 mm. The wafer may provide the foundation on which one or more semiconductor devices or features may be created using a variety of techniques and procedures, such as layering, photolithographic patterning, doping through implantation of ionic impurities, and heating. Example features on semiconductor devices that may be formed may include polycrystalline lines, polycrystalline gates, and device active areas.

The surface of the wafer may be partitioned into a plurality of die. As used in this document, a die refers to each portion of a wafer that may support one or more features after semiconductor fabrication processes are performed on the surface of the wafer and the wafer is cut into individual semiconductor devices. Those die that are located proximate to the edge of the wafer may be referred to as partial edge die. The partial edge die lie at least partially on the substantially rounded circumferential edge of the wafer. Thus, the partial edge die are partly on the top surface of the wafer and partly off the top surface of the wafer. By contrast, die that are not partial edge die and, thus, lie completely on the top surface of the wafer are complete or full die.

Figure 1A:
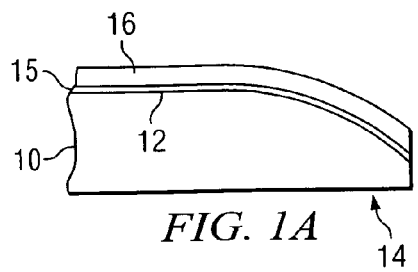
FIGS. 1A-1F are cross-sectional diagrams illustrating layers formed on the surface of a wafer for the formation of features in accordance with an embodiment of the present invention.

FIGS. 1A-1F are cross-sectional diagrams illustrating layers formed on the surface of a wafer 10 for the formation of features in accordance with an example embodiment of the present invention. Wafer 10 has a generally horizontal surface 12 on which a feature or die may be supported. Surface 12 near the circumferential edge 14 of wafer 10, however, is typically rounded such that wafer 10 has a substantially rounded profile near edge 14. In particular embodiments, the outer 3-5 mm of wafer 10, as measured from circumferential edge 14 of wafer 10, may comprise the substantially rounded portion of surface 12. The deviation from the flat surface of wafer 10 in this outer 3-5 mm may be as large as 1-10 microns. The depth-of-focus for ensuring linewidth integrity is typically 0.1 to 1 microns for a line width on the order of 80 to 250 nanometers. During the formation of features and devices on wafer 10, various layers may be deposited, grown, or otherwise formed on surface 12. FIG. 1A illustrates the surface of wafer 10 after an etch stop layer 15 and a first layer 16 are formed on surface 12 of wafer 10. In particular embodiments, etch stop layer 15 may comprise a silicon dioxide layer of a thickness on the order of approximately 10-40 Angstroms. First layer 16 may be formed on the outer surface of etch stop layer 15 and may comprise a polysilicon layer of a thickness on the order of approximately 1000 to 2500 Angstroms. For example, first layer 16 may comprise a polysilicon layer having a thickness on the order of 2200 Angstroms. In other embodiments, first layer 16 may be comprised of an electronically conductive metal. Example metal materials that may be used to form first layer 16 may include tungsten, titanium alloys, ruthenium, platinum, or other conductive alloys that are minimally interactive with any epitaxial or dielectric layers formed between wafer 10 and first layer 16.

Regardless of the material used to form first layer 16, first layer 16 may ultimately provide the material comprising the device feature formed on wafer 10. For example, a portion of first layer 16 may form a polycrystalline line after further semiconductor fabrication processes are performed on wafer 10. Although first layer 16 is described as being the first layer formed on the surface of wafer 10, it is contemplated that one or more intermediary layers may be formed on the surface of wafer 10 before the formation of first layer 16. Thus, first layer 16 need not be the first layer that is formed on wafer 10. For example, wafer 10 may have one or more epitaxial or dielectric layers formed on the surface of wafer 10, and first layer 16 may be formed on the one or more epitaxial or dielectric layers.

Figure 1B:
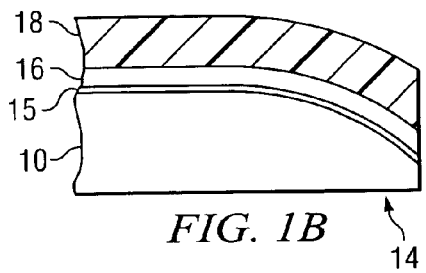

In FIG. 1B, a photoresist layer 18 is formed on the outer surface 19 of first layer 16. Photoresist layer 18 may comprise a resin that is initially insoluble in a developer but become soluble when exposed to light or another energy source. Thus, photoresist layer 18 may comprise a positive photoresist. In particular embodiments, spin-on techniques are used to deposit the resin material on the surface of wafer 10. The deposition may result in photoresist layer 18 of a thickness on the order of approximately 2000 to 8000 Angstroms. For example, photoresist layer 18 may be of a thickness on the order of 2500 Angstroms. After deposition of photoresist layer 18, the resin forming photoresist layer 18 may be allowed to cure. The curing process may include the baking or heating of wafer 10, which may cause photoresist layer 18 to harden. After photoresist layer 18 has cured sufficiently, a light source may be used to project light 20 onto wafer 10.

Figure 1C:
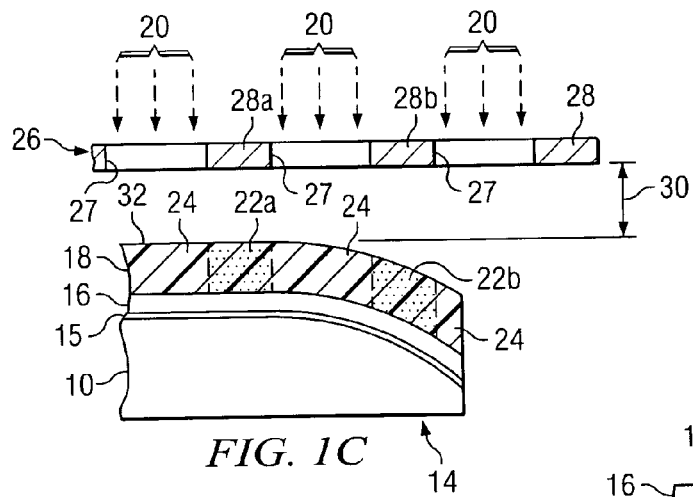

FIG. 1C illustrates the projection of light 20 on wafer 10. In various embodiments, exposing photoresist layer 18 to light 20 enables the creation of a photolithographic image on wafer 10. For example, photoresist layer 18 may undergo wavelength-specific, radiation-sensitive chemical reactions which cause the composition of any exposed portions 24 of photoresist layer 18 to change when photoresist layer 18 is exposed to light 20. For example, upon exposure to light, a photo acid generator produces a photo acid which in turn catalyzes the hydrolysis of dissolution inhibiting ester groups on the photoresist polymer backbone. The resulting polymer in the exposed regions of the photoresist contains carboxylic acid groups, making it soluble in an alkaline aqueous developer.

So that light 20 is only directed at the portions of photoresist layer 18 desired to be exposed, light 20 may be filtered through a mask 26. Mask 26 is positioned between the light source and wafer 10. Mask 26 typically comprises a metal layer with completely or partially opaque portions and completely or partially transparent portions. With the exception of one or more apertures 27 formed through mask 26, light 20 is reflected by mask 26. Specifically, light 20 is reflected by blocking portions 28. As a result, only light 20 passing through apertures 27 reaches the surface of wafer 10. Conversely, blocking portions 28 prevent the transmission of light 20 to portions 22 of photoresist layer 18 and leave portions 22 unexposed. Accordingly, the shape and size of a blocking portion 28 determines the shape and size of a corresponding unexposed portion 22. Thus, blocking portions 28 may be of any appropriate shape or size for preventing the exposure of the desired portions of photoresist layer 18. Additionally, because the portions of first layer 16 lying immediately below unexposed portions 22 of photoresist layer 18 will ultimately form a feature, the shape and size of blocking portions 28 and the placement of blocking portions 28 over wafer 10 also determine the shape and size of the features formed on wafer 10.

Another factor contributing to the formation of unexposed portions 22 is the lens-to-wafer distance 30 between mask 26 and wafer 10. Lens-to-wafer distance 30 is measured from a position on wafer 10 that is proximate to the center of wafer 10. Because lens-to-wafer distance 30 affects the defraction of light beams 20 on the surface 32 of wafer 10, lens-to-wafer distance 30 also influences the dimensions of unexposed portions 22. For example, in a particular embodiment, it may be desired that a feature formed using the semiconductor fabrication processes described has a baseline dimension on the order of 30 to 100 nm. Accordingly, it may be desired that unexposed portions 22 also have a baseline dimension on the order of 40 to 110 nm. To result in unexposed portions 22 with the desired baseline dimension, the lens-to-wafer distance 30 associated with mask 26 may be set at 2 to 10 mm. A lens-to-wafer distance 30 either higher or lower than the given range may result in a feature with dimensions that are smaller than desired.

In the illustrated example, mask 26 includes two exemplary blocking portions 28a and 28b. Accordingly, two unexposed portions 22a and 22b are generated from a single shot of light 20 from a light source, not shown. Unexposed portion 22a is located on that portion of surface 32 that is substantially horizontal. On the other hand, unexposed portion 22b is located proximate to circumferential edge 14. As illustrated, mask 26 may be positioned relative to surface 12 of wafer 10 such that lens-to-wafer distance 30 is at an optimum value for forming unexposed portion 22a. The lens-to-wafer distance 30 between mask 26 and unexposed portion 22b, however, is greater than the lens-to-wafer distance 30 between mask 26 and unexposed portion 22a. Consequently, the exposure of wafer 10 to light 20 at standard exposure intensities may result in a feature corresponding with unexposed portion 22b that has narrower dimensions than desired. Accordingly, the feature formed may be said to be overexposed. Overexposed deformities in the semiconductor devices and features may result in weakened adherence of the devices or features to wafer surface 32. For example, and as will be described in more detail below, portions of etch stop layer 15 beneath the formed feature may become undercut during subsequent etch processes.

Figure 1D:
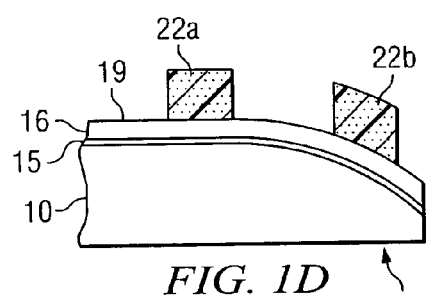

In FIG. 1D, wafer 10 is shown after exposed portions 24 of photoresist layer 18 are developed. Development may include a photo-lithographic process in which a chemical is used to dissolve selected parts of photoresist layer 18. For example, the developer may be selective to the exposed portions 24 of photoresist material. As a result, exposed portions 24 of photoresist layer 18 may be locally dissolved in the developer.

Figure 1E:
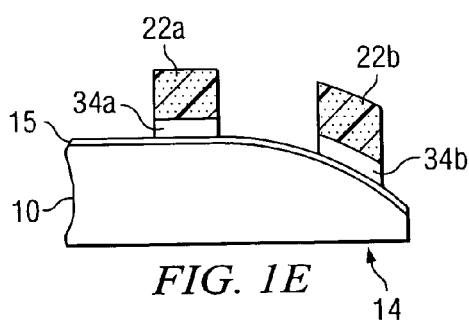

After exposed portions 24 of photoresist layer 18 are dissolved, outer surface 19 of first layer 16 may be etched using conventional etch processes. With the exception of those portions of first layer 16 that directly underlie unexposed portions 22, the etching of first layer 16 results in the selective removal of first layer 16. FIG. 1E illustrates wafer 10 after the selective removal of portions of first layer 16. In particular embodiments, anisotropic etch processes may be used to selectively remove portions of first layer 16. Anisotropic etch processes are typically performed using gases and plasma energy assisted processes rather than purely chemical reactions. The plasma etch process requires a plasma chamber, a vacuum system, gas supply, and a power supply. Essentially, wafer 10 is introduced into a plasma chamber at a specified pressure and gas flow rates. The power supply creates a radio frequency field through electrodes in place in the chamber. The field energizes the reactive gas mixture to a plasma state containing energized ions and neutrals. The reactive ions and neutrals attack the surface from one direction, resulting in vertical etch profiles. The present invention is not limited to anisotropic etch but may include isotropic etch such that etch occurs in all directions in approximately equal amounts. Isotropic etch can proceed in all directions at the same rate while anisotropic etch is any etch that is not isotropic.

The etch process used to form a features 34 from first layer 16 can be designed to be selective to etch-stop layer 15, which forms an intermediary layer between wafer 10 and first layer 16. If, for example, first layer 16 includes polysilicon and the photoresist material forming unexposed portions 22 includes an irradiated resin, the etch process may be designed to be selective to photoresist 18 relative to the polysilicon of first layer 16. In other words, the etch chemistry used to form features 34 will remove the polysilicon within first layer 16 without substantially removing the photoresist material forming unexposed portions 22. Additionally, the etch process may be designed to be selective to the material forming etch-stop layer 15 relative to the polysilicon of first layer 16. Stated differently, the etch chemistry may remove the polysilicon within first layer 16 without substantially removing the material forming etch-stop layer 15. Thus, the photoresist material of unexposed portions 22 acts as a barrier preventing the permeation of the etching chemical into the portions of first layer 16 that lie directly below unexposed portions 22. The portion of first layer 16 that remains on outer surface 12 of wafer 10 after the etch process is completed may comprise an at least partially formed semiconductor device or feature 34.

Figure 1F:
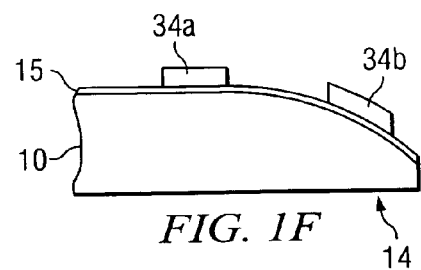

In FIG. 1F, wafer 10 is illustrated after unexposed portions 22 are removed from the surfaces of features 34. Because mask 26 included two blocking portions 28 and, consequently, two unexposed portions 22a and 22b were formed in photoresist layer 18, two features 34a and 34b are illustrated. However, it is contemplated that a single feature may be formed on the surface of wafer 10 or many features may be formed on the surface of wafer 10. As described above, overexposure deformities, such as narrow lines, result in a weakened adherence of features 34b to outer surface 12 of wafer 10. Subsequent manufacturing processes may result in the feature 34b being detached from outer surface 12. Where feature 34b becomes detached during, for example, an etch process or a chemical bath, the detached feature may become debris that may adhere itself to other portions of wafer 10 or to other wafers undergoing similar processes using the same equipment.

To prevent overexposure deformities in shot areas including partial edge die proximate to circumferential edge 14, the exposure intensity of light 20 may be decreased. As the exposure intensity of light 20 is decreased, the lower exposure intensity, or partial exposure, of the photoresist material forming exposed portion 22b results in an increased linewidth of a feature associated with the exposed portion 22b. Thus, it may be desired to vary the exposure intensity of light 20 based on the location of the dies or group of dies being shot on wafer 10. Die that are near the center of a wafer may be shot with a higher exposure intensity of light 20 than the partial edge die. For example, where a linewidth on the order of 10 to 100 nm is desired for all features 34, the die that are near the center of wafer 10 may be shot with light 20 at an exposure intensity on the order of 28 to 30 mJ. Die that are near circumferential edge 14, however, may be shot with light 20 at a reduced exposure intensity on the order of 20 to 24 mJ. The disclosed exposure intensities, however, are merely provided as examples. The assignment of exposure intensities may vary depending on the nominal feature dimension, the type of photoresist used, the type of scanner device, the lens-to-wafer distance, and the wafer edge flatness profile, etc. In this manner, the exposure intensity may be varied during the formation of features 34 to achieve features free of overexposed narrow linewidth deformities.

Figure 2:
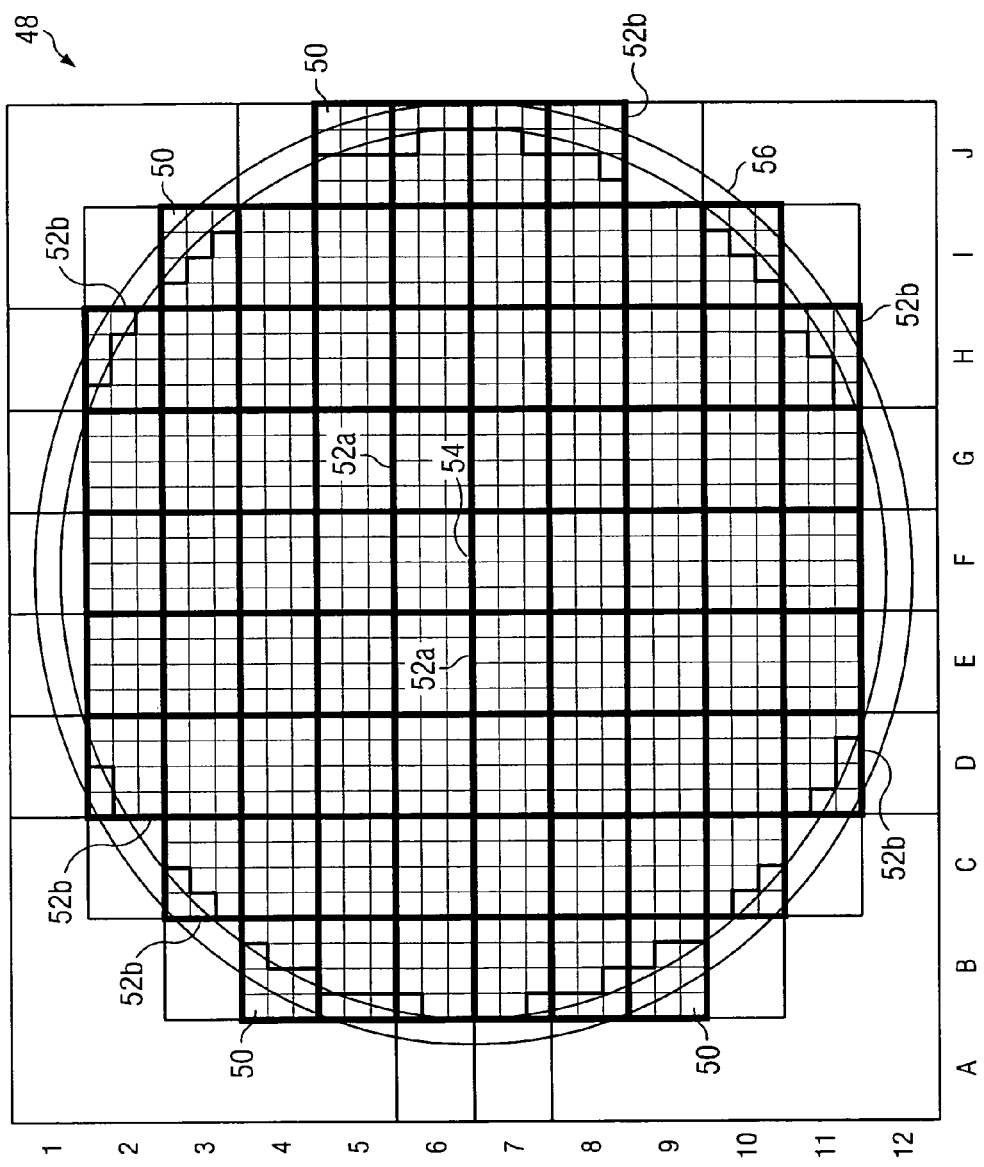
FIG. 2 is a diagram of a wafer map illustrating the partitioning of die into groups in accordance with an embodiment of the present invention.

For the assignment of the appropriate exposure intensities to shot areas on a wafer, the die may be partitioned into groups, and an appropriate exposure intensity may be assigned to each group. Each group may correspond to a shot area. The shot area includes the spatial area receiving energy from a light source during a single shot of light 20. FIG. 2 is a diagram of a wafer map 48 illustrating the partitioning of die 50 into groups 52 in accordance with an embodiment of the present invention. As discussed above, the surface of wafer 10 may be partitioned into a plurality of die 50, wherein each die 50 refers to the portion of a wafer that may support one or more features 34 after wafer 10 is cut into individual semiconductor devices. In the illustrated embodiment, wafer 10 has been partitioned into ninety-four groups 52, and each group 52 includes an array of as many as twelve die 50. Groups 52 near circumferential edge 56 may include fewer than twelve die and may include one or more partial edge die. Depending on the location of a group 52 on wafer map 48, the group 52 may include full die, partial die, or a combination of both. For purposes of illustration, wafer map 48 includes a coordinate system to identify each group 52 of die 50 on wafer 10.

Groups 52 of die 50 located similarly on the surface of wafer 10 may have similar characteristics. For example, groups 52 that are not proximate to circumferential edge 56 of wafer 10 (such as the groups 52a identified by the coordinates E6, E7, F6, F7, G6, G7, and other like groups) may include features are formed on a substantially horizontal surface of the wafer product die and, thus, may include product die. Because the die in groups 52a do not include partial edge die, the features formed on die within groups 52a do not suffer from overexposure deformities at conventional exposure intensities. In particular embodiments, the features formed on product die in groups 52a may look similar to feature 34a, described with regard to FIG. 1E. For example, the linewidth of the features may be on the order of 10 to 100 nm when light 20 at standard exposure intensity on the order of 28 to 32 mJ is used to form exposed portions 22 in photoresist layer 18.

In contrast, groups 52 that are located proximate circumferential edge 56 of wafer map 48 (such as the groups 52b identified by the coordinates B3-B10, C3, C10, and other like groups) may include features similar to feature 34b, also described with regard to FIG. 1E. Because the features may be formed on the rounded circumferential edge 14 of the wafer, one or more die in groups 52b may comprise non-product or partial edge die. Thus, the features formed on die 50 in groups 52b near circumferential edge 56 may include focal deformities resulting in reduced adherence of the features to wafer 10. For example, the linewidth of the features formed near circumferential edge 56 may less than that of features formed near the center of wafer 10 at standard exposure intensities.

Figure 3:
FIG. 3 is a diagram of a wafer map illustrating the assignment of varying exposure intensities to groupings of die on a wafer.

To prevent the occurrence of narrowed linewidth deformities, each group 52 of die 50 represented on wafer map 48 may be assigned an exposure intensity. The assigned exposure intensity may be based at least in part on each group's location on wafer map 48. Specifically, lower exposure intensities of light 20 may be assigned to groups 52b than is assigned to groups 52a. The varying exposure intensities may be indicated on a wafer grid that corresponds to wafer map 48. The exposure intensities for each group 52 may be indicated using codes, symbols, or other indicators to identify the association of an exposure intensity with the particular group 52. FIG. 3 is a diagram of a wafer grid 60 illustrating the assignment of codes to groups 52. The codes identify the appropriate exposure intensity of light 20 to be used to form features 34 with the desired baseline dimensions.

As discussed above, the codes are assigned to each group 52 based at least in part on the location of the particular group 52 on wafer map 48. Accordingly, groups 52a, which include product die rather than partial edge die, are assigned a code of "1". In particular embodiments, a code of "1" may be associated with a standard exposure intensity. Thus, "1" may indicate to an operator or controller of light source 12 that the particular group 52a is to receive a shot of light 20 at a standard exposure intensity on the order of 28 to 32 mJ. Although an exposure intensity in the stated range may prevent the formation of overexposure deformities in features formed in groups 52a, however, the stated exposure intensity is merely provided as an example.

In contrast, groups 52b, which include product and non-product die located near circumferential edge 56 of a wafer may be assigned a different code to indicate that a different exposure intensity should be used for die in groups 52b. In the illustrated example, a code of "2" is assigned to groups 52b. In particular embodiments, the code of "2" may be associated with an exposure intensity that is less than the standard intensity. For example, "2" may indicate that an exposure intensity on the order of 20 to 24 mJ may be used to irradiate the photoresist material associated with die 50 in groups 52b. Although an exposure intensity in the stated range may prevent the formation of under-sizing deformities in features formed in groups 52b, the stated exposure intensity is merely provided as an example. Any exposure intensity suitable for preventing reduced baseline dimensions in features formed near the circumferential edge of a wafer may be used. For example, the exposure intensity assigned to groups 52b including partial edge die may be less than the exposure intensity assigned to groups 52a including only product die by 1 to 50 percent. In particular embodiments, the exposure intensity assigned to groups 52b may be less than the exposure intensity assigned to groups 52a by approximately 30 percent.

Although wafer grid 60 depicts codes being assigned to groups 52 of die 50, it is generally recognized that any system of assigning exposure intensities to groups 52 of die 50 on a wafer may be used. For example, as an alternative embodiment, grid 60 might explicitly identify the exposure intensities assigned to each group of die. Alternatively, grid 60 might identify the exposure intensity as a percentage of a standard exposure intensity.

Figure 4:
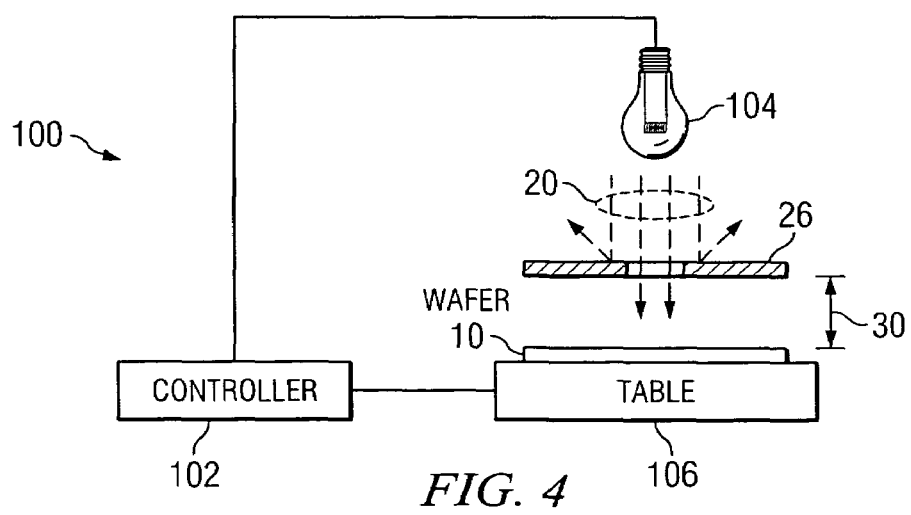
FIG. 4 is a diagram illustrating a system for the exposure of partial edge die in accordance an embodiment of the present invention.

FIG. 4 is a diagram illustrating a system 100 for the exposure of partial edge die in accordance with an embodiment of the present invention. System 100 includes a controller 102, a light source 104, and a wafer table 106. For the formation of features and devices on the surface of a wafer 10, using processes similar to those described above with regard to FIGS. 1A-1F, wafer 10 is placed on or supported on wafer table 106. Wafer 10 may be positioned such that shots of light 20 are sequentially directed at selected die or groupings of die on wafer 10. For each die or grouping of die, the shot of light 20 may be transmitted at an assigned exposure intensity that is appropriate for the die or grouping of die based on the location of the die on the surface of wafer 10.

Light source 104 includes a laser, lamp, or other suitable apparatus for generating a beam of light 20 that is directed at wafer 10. The beam of light 20 in a single shot operates to expose a portion of the photoresist material 18 formed on wafer 10. The portion that is exposed comprises a shot area, which includes the one or more die receiving beam of light 20. As was described in detail with regard to FIGS. 1A-1F, light 20 transmitted from light source 104 may operate to expose portions of photoresist layer 18. The unexposed portions of photoresist layer 18 may then act as a passivation or etch barrier to protect any intermediary layers formed between photoresist layer 18 and surface 12 of wafer 10, such as first layer 16, during subsequent fabrication processes, such as etch steps.

In various embodiments, light 20 from light source 104 is filtered by mask 26. Mask 26 is positioned between light source 104 and wafer 10. Specifically, light 20 passes through one or more apertures 27 before reaching the surface of wafer 10. For the alignment of wafer 10 with mask 26, controller 102 may include appropriate circuitry for adjusting the position of wafer table 106, mask 26, light source 104, or any combination of these or other components of system 100. Accordingly, controller 102 is shown coupled to light source 104 and wafer table 106. In operation, controller 102 may operate to mechanically or robotically reposition any of the aforementioned components of system 100 between each shot of light 20. Thus, controller 102 may operate to mechanically or robotically position wafer table 106 at a desired position. In other embodiments, controller 102 may operate to mechanically or robotically reposition mask 26 and/or light source 104. Although a single controller 102 is illustrated as being coupled to the light source 104 and wafer table 106, it is contemplated that each component within system 100 may be associated with a controller. Accordingly, it is contemplated that the functionality described for controller 102 may be performed by one or many controllers within system 100. Additionally, some or all of the functionality described may be performed by one or more controllers external to system 100.

In various embodiments, controller 102 also includes the circuitry and software necessary to control the operations of light source 104. Specifically, controller 102 may direct the emission of light 20 from light source 104. For example, controller 102 may direct light source 104 to emit the appropriate exposure intensity of light 20 assigned to a given die or group of die. As described above, the exposure intensity may be assigned to the particular die or group of die receiving light 20 based on the location of the die or group of die on wafer 10. For example, where a die or group of die that includes one or more partial edge die is aligned with mask 26, controller 102 may direct light source 104 to generate a shot of energy on the order of 20 to 24 mJ. As another example, where a die or group of die near the center of wafer 10 is aligned with mask 26, controller 102 may direct light source 104 to generate a shot of energy on the order of 28 to 32 mJ.

In this manner, light source 104 may cooperate with controller 102 to vary the exposure intensities emitted by light source 104 as is appropriate for the reduction of overexposure deformities. Accordingly, linewidth dimensions associated with features formed on the edge of wafer 10 may be increased to compensate for under-sizing caused by wafer edge topography and adherence of the features to the edge of wafer 10 may be improved. As a result, fewer features may become detached from wafer 10 during subsequent fabrication processes. The occurrence of gross particles in wet clean baths may be reduced, and the contamination of wafer 10 and other wafers using the semiconductor fabrication equipment substantially prevented.

Although the present invention has been described in detail, it should be understood that various changes, alterations, substitutions, and modifications can be made to the teachings disclosed herein without departing from the spirit and scope of the present invention which is solely defined by the appended claims. For example, the present invention has been described for patterning with positive photoresist in which unexposed resist serves as the blocking layer. An alternative embodiment, however, might use negative photoresist, for which the exposed resist serves as the blocking layer. In that case, the exposure intensity of partial edge die should be increased relative to its value at the wafer center to compensate for reduced line width due to the wafer edge topography.

What is claimed is:

1. A method of forming a semiconductor device, comprising:
    forming a photoresist layer on a surface of a wafer, the wafer comprising an array of die that includes a plurality of complete die and at least one partial edge die, the wafer having an edge that has a substantially rounded cross-sectional profile causing undersized patterns in semiconductor devices formed on partial edge die;
    assigning a first exposure intensity to a first group of die on the surface of the wafer, the first group of die comprising a group of complete die, the assignment of the first exposure intensity based at least in part on the location of the first group of die on the surface of the wafer;
    assigning a second exposure intensity to a second group of die on the surface of the wafer, the second group of die comprising at least one partial edge die, the second exposure intensity less than the first exposure intensity to compensate for reduced line width due to the wafer edge topography; and
    directing energy at the second group of die at the second exposure intensity to avoid over-exposure of the second group of die.

2. The method of claim 1, wherein each of the first and second groups of die correspond with a shot area associated with a light source.

3. The method of claim 1, wherein forming the photoresist layer on the surface of the wafer comprises forming the photoresist layer proximate to a polysilicon layer formed on the surface of the wafer.

4. The method of claim 3, wherein the polysilicon layer forms a layer within a semiconductor device having a line width on the order of 10 to 100 nm.

5. The method of claim 1, wherein forming the photoresist layer on the surface of the wafer comprises forming the photoresist layer proximate to a metal or metal-alloy layer formed on the surface of the wafer.

6. The method of claim 1 wherein the second exposure intensity is less than the first exposure intensity by 1 to 50 percent.

7. The method of claim 1, further comprising;
    positioning a mask comprising at least one aperture and at least one blocking portion proximate to the surface of the wafer; and
    directing energy through the mask to underexpose an area of the photoresist layer that corresponds with the second group of die.

8. The method of claim 1, wherein directing energy at the second group of die comprises directing energy from a light source operable to photochemically decompose one or more dissolution inhibitors in the photoresist layer.

9. A method of forming a semiconductor device, comprising:
    forming a photoresist layer on a surface of a wafer, the wafer comprising an array of die that includes a plurality of complete die and at least one partial edge die, the wafer having an edge that has a substantially rounded cross-sectional profile causing undersized patterns in semiconductor devices formed on partial edge die;

assigning a first exposure intensity to a first group of die on the surface of the wafer, the first group of die comprising a group of complete die, the assignment of the first exposure intensity based at least in part on the location of the first group of die on the surface of the wafer;

assigning a second exposure intensity to a second group of die on the surface of the wafer, the second group of die comprising at least one partial edge die, the second exposure intensity greater than the first exposure intensity to compensate for reduced line width due to the wafer edge topography; and directing energy at the second group of die at the second exposure intensity to avoid under-exposure of the second group of die.

10. The method of claim 9, wherein each of the first and second groups of die correspond with a shot area associated with a light source.

11. The method of claim 9, wherein the second exposure intensity is greater than the first exposure intensity by 1 to 50 percent.

12. The method of claim 9, further comprising:

positioning a mask comprising at least one aperture and at least one blocking portion proximate to the surface of the wafer; and directing energy through the mask to underexpose an area of the photoresist layer that corresponds with the second group of die.

* * * * *